United States Patent
Whitcomb et al.

(10) Patent No.: US 8,486,537 B2
(45) Date of Patent: Jul. 16, 2013

(54) TRANSPARENT CONDUCTIVE FILMS, ARTICLES, AND METHODS

(75) Inventors: David R. Whitcomb, Woodbury, MN (US); Chaofeng Zou, Maplewood, MN (US)

(73) Assignee: Carestream Health, Inc., Rochester, NY (US)

( * ) Notice: Subject to any disclaimer, the term of this patent is extended or adjusted under 35 U.S.C. 154(b) by 147 days.

(21) Appl. No.: 13/042,101

(22) Filed: Mar. 7, 2011

(65) Prior Publication Data

US 2011/0232945 A1    Sep. 29, 2011

Related U.S. Application Data

(60) Provisional application No. 61/310,828, filed on Mar. 5, 2010, provisional application No. 61/310,891, filed on Mar. 5, 2010, provisional application No. 61/310,898, filed on Mar. 5, 2010.

(51) Int. Cl.
*C03C 17/06* (2006.01)

(52) U.S. Cl.
USPC ........... 428/433; 428/434; 977/762; 977/773; 977/932

(58) Field of Classification Search
None
See application file for complete search history.

(56) References Cited

U.S. PATENT DOCUMENTS

| | | | |
|---|---|---|---|
| 4,401,743 A | 8/1983 | Incremona | |
| 4,408,532 A | 10/1983 | Incremona | |
| 6,333,285 B1 | 12/2001 | Chopinet et al. | |
| 6,518,211 B1 | 2/2003 | Bradshaw et al. | |
| 7,309,671 B2 | 12/2007 | Kurachi et al. | |
| 7,507,447 B2 | 3/2009 | Hirai et al. | |
| 7,666,511 B2 | 2/2010 | Ellison et al. | |
| 7,677,058 B2 | 3/2010 | Hawtof et al. | |
| 2006/0135028 A1* | 6/2006 | Klyszcz et al. | 445/24 |
| 2006/0251874 A1* | 11/2006 | McClure et al. | 428/210 |
| 2007/0059901 A1* | 3/2007 | Majumdar et al. | 438/455 |
| 2008/0171193 A1 | 7/2008 | Yi et al. | |
| 2008/0280057 A1* | 11/2008 | Hawtof et al. | 427/450 |
| 2008/0292979 A1 | 11/2008 | Ding et al. | |
| 2009/0191356 A1* | 7/2009 | Lee et al. | 427/535 |
| 2009/0197088 A1 | 8/2009 | Murata | |
| 2009/0220761 A1 | 9/2009 | Dejneka et al. | |
| 2009/0233086 A1 | 9/2009 | Hirai | |
| 2009/0298669 A1 | 12/2009 | Akiba et al. | |
| 2010/0107694 A1 | 5/2010 | Dannoux et al. | |
| 2010/0291346 A1 | 11/2010 | Hawtof et al. | |
| 2010/0319401 A1 | 12/2010 | Coffey et al. | |

FOREIGN PATENT DOCUMENTS

| | | |
|---|---|---|
| EP | 1 947 701 | 7/2008 |
| EP | 1 965 438 | 9/2008 |
| JP | 2007-200659 | 8/2007 |
| WO | WO 03/106573 | 12/2003 |

OTHER PUBLICATIONS

Research Disclosure, No. 308119, Dec. 1989, 46 pages.
PCT International Search Report dated Oct. 11, 2011 for International Application No. PCT/US2011/000426, 2 pages.

* cited by examiner

*Primary Examiner* — David Sample
(74) *Attorney, Agent, or Firm* — Reed L. Christiansen

(57) ABSTRACT

Transparent conductive films, articles made from them, and methods of making them are disclosed. Some transparent conductive films include flexible glass substrates and conductive layers containing metal nanoparticles. Others include at least one layer with cell walls that contain metal nanorods or conductive nanowires. Still others include a substrate with a coating disposed on it, with the coating including conductive components and photopolymers. Such films are useful in such articles as electronic displays, touch screens, and the like.

6 Claims, No Drawings

TRANSPARENT CONDUCTIVE FILMS, ARTICLES, AND METHODS

CROSS REFERENCE TO RELATED APPLICATIONS

Priority is claimed from U.S. Provisional Application No. 61/310,828, filed Mar. 5, 2010, U.S. Provisional Application No. 61/310,891, filed Mar. 5, 2010, and U.S. Provisional Application No. 61/310,898, filed Mar. 5, 2010, are hereby incorporated by reference in their entirety.

SUMMARY

At least one first embodiment provides a transparent conductive film comprising a flexible glass substrate and at least one conductive layer disposed on the flexible glass substrate, where the at least one conductive layer comprises at least one metal nanoparticle.

In at least some embodiments, the flexible glass substrate has an average thickness less than about 500 μm, or less than about 150 μm, or less than about 100 μm, such as, for example, an average thickness greater than about 10 μm and less than about 100 μm. In at least some embodiments, the flexible glass substrate can achieve a radius of curvature greater than about 5 mm and less than about 50 cm without breaking, such as, for example, a radius of curvature greater than about 10 mm and less than about 10 cm without breaking. The flexible glass substrate may, for example, comprise an ion-exchanged glass. In at least some embodiments, the flexible glass substrate comprises at least one compression stress layer. The flexible glass substrate may, for example, comprise at least one of a silicate glass, an alkali silicate glass, an alkali aluminosilicate glass, an aluminosilicate glass, a borosilicate glass, an alkali aluminogermanate glass, an alkali germanate glass, or an alkali gallogermanate glass.

In at least some embodiments, the at least one metal nanoparticle comprises at least one nanowire, nanocube, nanorod, nanopyramid, or nanotube, or the at least one metal nanoparticle comprises at least one nanowire. The at least one metal nanoparticle may, for example, comprise at least one coinage metal, such as, for example, silver.

In at least some embodiments, the at least one conductive layer has a surface resistivity of less than about 150 ohms/sq, or less than about 125 ohms/sq, or less than about 100 ohms/sq, or less than about 75 ohms/sq, or less than about 65 ohms/sq, such as, for example, a surface resistivity of about 110 ohms/sq or a surface resistivity of about 60 ohms/sq.

In at least some embodiments, the transparent conductive film has a total light transmission of at least about 80%, or of at least about 85%. Or the transparent conductive films have ASTM D1003 haze values of less than about 10%, such as, for example, haze values of about 9.38% or haze values of about 5.22%.

In at least some embodiments, the transparent conductive film further comprises at least one layer disposed between the flexible glass substrate and the at least one conductive layer.

At least one second embodiment provides an article comprising a transparent conductive film comprising a flexible glass substrate and at least one conductive layer disposed on the flexible glass substrate, where the at least one conductive layer comprises at least one metal nanoparticle. In some embodiments, such an article may comprise an electronic display, a touch screen, or the like. Such an article may, for example, comprise a portable telephone, a cellular telephone, a computer display, a laptop computer, a tablet computer, a point-of-purchase kiosk, a music player, a television, an electronic game, an electronic book reader, or the like.

At least one third embodiment provides a method comprising providing a flexible glass substrate and coating the flexible glass substrate with at least one composition comprising at least one nanoparticle. In at least some embodiments, the flexible glass substrate is provided on a roll.

At least some embodiments provide the coated flexible glass substrate produced by such methods.

At least some embodiments provide such methods that further comprise forming a transparent conductive film from the coated flexible glass substrate.

At least some embodiments provide the transparent conductive film produced by such methods.

These and other embodiments will be understood from the description, the examples, and the claims that follow.

DESCRIPTION

U.S. Provisional Application No. 61/310,828, filed Mar. 5, 2010, U.S. Provisional Application No. 61/310,891, filed Mar. 5, 2010, and U.S. Provisional Application No. 61/310,898, filed Mar. 5, 2010, are hereby incorporated by reference in their entirety.

Transparent Conductive Films

Transparent conductive films have commonly comprised polymeric substrates, which can be flexible and amenable to continuous web coating manufacturing technologies. However, polymeric substrates are often hazy and can develop physical defects, such as surface scratches and scuffs, which can affect transparency. Glass, in contrast, can provide good transparency, but because of its typical poor flexibility, has commonly been processed batchwise. The products of such batch processes can be more costly and less uniform than those than those made using continuous processes.

Applicants disclose and claim embodiments that provide transparent conductive films comprising flexible glass substrates on which one or more conductive coating layers are disposed. Such transparent conductive films can be amenable to continuous web coating manufacturing technologies, while also being more scratch-resistant and more optically transparent than films comprising polymeric substrates. Such transparent conductive films can be suitable for such applications as electronic displays, touch screens, or other elements that may make up such devices as portable telephones, cellular telephones, computer displays, laptop computers, tablet computers, point-of-purchase kiosks, music players, televisions, electronic games, electronic book readers, and the like.

The transparent conductive films may have a total light transmission of at least about 80%, or of at least about 85%. Or the transparent conductive films may have ASTM D1003 haze values of less than about 10%, such as, for example, haze values of about 9.38% or haze values of about 5.22%.

Flexible Glass Substrates

Some embodiments comprise flexible glass substrates. The flexible glass substrates may, for example, comprise at least one of a silicate glass, an alkali silicate glass, an alkali aluminosilicate glass, an aluminosilicate glass, a borosilicate glass, an alkali aluminogermanate glass, an alkali germanate glass, an alkali gallogermanate glass, or the like. Commercially available flexible glass substrates include, for example, glasses marketed by Corning under the GORILLA® trade name and glasses marketed by Asahi Glass under the DRAGONTAIL™ trade name.

Ion-Exchanged Glass and Compression Stress Layers

Such flexible glass substrates may, for example, comprise an ion-exchanged glass. By replacing some of the alkali metal ions in the glass with differently sized ions, at least a portion of the glass substrate can become compression stress hardened, for example, in a compression stress layer. Such ion-exchanged glass compositions are described in, for example, U.S. Pat. No. 6,333,285 to Chopinet et al., granted Dec. 25, 2001; U.S. Pat. No. 6,518,211 to Bradshaw, et al., granted Feb. 11, 2003; U.S. Pat. No. 7,309,671 to Kurachi et al., granted Dec. 18, 2007; U.S. Patent Application Publication 2009/0197088, published Aug. 6, 2009; U.S. Patent Application Publication 2009/0220761, published Sep. 3, 2009; U.S. Patent Application Publication 2009/0298669, published Dec. 3, 2009; and U.S. Pat. No. 7,666,511 to Ellison et al., granted Feb. 23, 2010, each of which is hereby incorporated by reference in its entirety.

Substrate Thicknesses and Radii of Curvature

In at least some embodiments, the flexible glass substrate has an average thickness less than about 500 µm, or less than about 150 µm, or less than about 100 µm, such as, for example, an average thickness greater than about 10 µm and less than about 100 µm. In at least some embodiments, the flexible glass substrate can achieve a radius of curvature greater than about 5 mm and less than about 50 cm without breaking, such as, for example, a radius of curvature greater than about 10 mm and less than about 10 cm without breaking. For the purpose of this application, to "achieve a radius of curvature without breaking" is to have the glass substrate survive intact when being bent from a first radius of curvature larger than the claimed range to a second radius of curvature contained within the claimed range.

Some such substrates may be stored and supplied on rolls suitable for use in continuous web coating manufacturing. Processes for manufacturing such glass substrates are described in, for example, U.S. Pat. No. 7,677,058 to Hawtof et al., granted Mar. 16, 2010; U.S. Patent Application Publication 2010/0107694, published May 6, 2010; U.S. Patent Application Publication 2010/0291346, published Nov. 18, 2010; and U.S. Patent Application Publication 2010/0319401, published Dec. 23, 2010, each of which is hereby incorporated by reference in its entirety.

Conductive Layers

At least some embodiments provide at least one conductive layer disposed on the flexible glass substrate. Such conductive layers may comprise at least one metal nanoparticle. For the purpose of this application, a nanoparticle is an object with at least one dimension less than about 100 nm. Examples of nanoparticles include nanowires, nanocubes, nanorods, nanopyramids, nanotubes, and the like. Conductive layers comprising nanowires are described in, for example, European Patent Application Publication EP 1 965 438, published Sep. 3, 2008, which is hereby incorporated by reference in its entirety. Nanoparticles may be constructed from any of a variety of metals, such as, for example, coinage metals, including silver, gold, copper, and the like. In at least some embodiments, the at least one conductive layer may comprise a conductive network of nanoparticles, such as, for example, a conductive network of nanowires. The concentration of such nanoparticles in the at least one conductive layer is preferably sufficiently high to comprise such a conductive network. While not wishing to be bound by theory, such a concentration may, for example, be higher than a percolation threshold for the at least one conductive layer.

The at least one conductive layer may optionally comprise one or more polymers, copolymers, or oligomers, such as, for example, acrylic polymers, vinyl polymers, polyesters, polycarbonates, styrenic polymers, polyurethanes, polyolefins, epoxy polymers, cellulosic polymers, silicone polymers, phenolic polymers, fluoropolymers, rubbers, conductive polymers, semiconductive polymers, nonconductive polymers, and the like. The concentration of such polymers, copolymers, or oligomers is preferably low enough not to reduce the conductivity of the layer below that required for the intended application.

The at least one conductive layer may optionally comprise other additive components, such as corrosion inhibitors, viscosity modifiers, surfactants, and the like. These and other additive components will be understood by those skilled in the art. The concentration of such additives is preferably low enough not to reduce the conductivity of the layer below that required for the intended application.

In at least some embodiments, the at least one conductive layer has a surface resistivity of less than about 150 ohms/sq, or less than about 125 ohms/sq, or less than about 100 ohms/sq, or less than about 75 ohms/sq, or less than about 65 ohms/sq, such as, for example, a surface resistivity of about 110 ohms/sq or a surface resistivity of about 60 ohms/sq. Surface resistivity may, for example, be measured using an R-CHEK™ RC2175 four-point resistivity meter.

Other Layers

In at least some embodiments, the transparent conductive film further comprises at least one layer disposed between the flexible glass substrate and the at least one conductive layer. Such a layer may, for example, might be provided to improve adhesion between the flexible glass substrate and the at least one conductive layer.

Or the transparent conductive film might, for example, further comprise at least one layer disposed on the at least one conductive layer. Such layers might comprise electronic device functional layers, such as, for example, active layers for organic photovoltaic devices or active layers for organic light emitting diodes. Or they might comprise structural layers, such as, for example, overcoat layers.

Or the transparent conductive film might, for example, further comprise at least one layer disposed on the side of the flexible glass substrate opposite that which the at least one conductive layer is disposed. Such layers comprise, for example, additional conductive layers, backcoat layers, electronic device active layers, structural layers, and the like.

Articles Comprising Transparent Conductive Films

Some embodiments provide articles comprising transparent conductive films of the at least one first embodiment. Such articles may, for example, comprise electronic displays, touch screens, and the like, for use in such applications as portable telephones, cellular telephones, computer displays, laptop computers, tablet computers, point-of-purchase kiosks, music players, televisions, electronic games, electronic book readers, and the like. These and other such articles will be understood by those skilled in the art.

Fabrication Methods and Product Films

Some embodiments provide methods comprising providing a flexible glass substrate and coating the flexible glass substrate with at least one composition comprising at least one nanoparticle. The flexible glass substrate may, for example, be provided on a roll. Other embodiments provide the coated flexible glass substrates produced by such methods. Such coated flexible glass substrates may, for example, be taken up on rolls and supplied from rolls for further processing. Still other embodiments provide such methods that further comprise forming a transparent conductive film from the coated flexible glass substrate. Yet other embodiments provide the transparent conductive films produced by such methods. Such transparent conductive films may, for example, be taken up on rolls for storage, distribution, sale, or further processing.

Such methods may comprise disposing one or more coating mixes on the flexible glass substrate to form one or more coating layers, such as, for example, one or more conductive layers. The various coating mixes may use the same or different solvents, such as, for example, water or organic solvents. Layers may be coated one at a time, or two or more layers may be coated simultaneously, for example, through use of slide coating.

Layers may be coated using any suitable methods, including, for example, dip-coating, wound-wire rod coating, doctor blade coating, air knife coating, gravure roll coating, reverse-roll coating, slide coating, bead coating, extrusion coating, curtain coating, and the like. Examples of some coating methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Such methods may comprise drying one or more coated layers, using a variety of known methods. Examples of some drying methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Such methods may be executed batchwise, semicontinuously, or continuously. Materials used in such methods may, for example, be supplied in roll form. Intermediate materials may, for example, be taken up and stored in roll form for later processing. Products may, for example, be taken up and stored in roll form, suitable for such activities as inventorying, distribution, sale, or further processing. In some cases, intermediates or end products may be reduced in size from their web-based form, using such methods as slicing, punching, cutting, and the like. It will be understood that, in many cases, continuous or semicontinuous processing of web-based materials supplied from or taken up on rolls may decrease production costs and increase uniformity of the intermediates and products produced from such methods, relative to those produced purely batchwise.

Cellular Structured Films and Methods

Some embodiments provide transparent conductive films comprising a substrate and at least one layer disposed in the substrate, the at least one layer comprising cell walls, where the cell walls comprise one or more of conductive nanorods, conductive nanowires, or conductive nanotubes.

A method of forming such a layer is described in PCT Patent Publication WO 2003/106573, published Dec. 24, 2003, which is hereby incorporated by reference in its entirety. A coating mixture comprising metal nanopowders, volatile solvents, and polymers is disposed on a substrate, after which the volatile solvent is evaporated. The resulting coating exhibits a two-dimensional cellular foam structure. Because of the approximately spherical shape of the metal nanopowders, a high concentration is required to allow sufficient connectivity to allow the cellular structure to be conductive. Such high loadings of nanopowders lead to low transparency of the resulting film.

Layers may be coated using any suitable methods, including, for example, dip-coating, wound-wire rod coating, doctor blade coating, air knife coating, gravure roll coating, reverse-roll coating, slide coating, bead coating, extrusion coating, curtain coating, and the like. Examples of some coating methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Such methods may comprise drying one or more coated layers, using a variety of known methods. Examples of some drying methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Applicants employ nanorods or nanowires or nanotubes to provide improved films. Polymer emulsions may also be employed, as well. Use of nanorods, nanowires, or nanotubes provides increased conductivity in the cell walls of the foam structure. Without wishing to be bound by theory, it is believed that the higher aspect ratio of the nanorods, nanowires, and nanotubes relative to that of the nanopowders aids their alignment during cell wall formation. Equivalent conductivity may therefore be achieved at lower metal loadings, improving film transparency. Moreover, use of nanorods, nanowires, or nanotubes may allow elimination of high temperature sintering required to increase the conductivity of the nanopowder-based formulations.

In at least some embodiments, the layer comprising cell walls further comprises voids at least partially surrounded by the cell walls. Such voids may be free of conductive nanorods, nanowires, and nanotubes. Such voids may, for example, be formed by volatilizing a solvent that has low solubility in the phase carrying the nanorods, nanowires, or nanotubes.

In some embodiments, the nanorods, nanowires, or nanotubes comprise conductive metal. In other embodiments, the nanorods, nanowires, or nanotubes comprise conductive carbon. In still other embodiments, both conductive metals and conductive carbon may be used.

Still other embodiments provide such transparent conductive films, where the substrate is a flexible glass substrate.

Photopolymer Films and Methods

Some embodiments provide transparent conductive films comprising a substrate and at least one layer disposed on the substrate, where the at least one layer comprises conductive components and at least one photopolymer composition. Such conductive components may, for example, comprise carbon nanotubes, metal nanoparticles, or the like. For the purpose of this application, "photopolymer composition" refers to a composition that is radiation curable to form a polymer. In at least some embodiments, such a photopolymer composition may be cured by exposure to, for example, ultraviolet radiation.

In at least some embodiments, the at least one layer may be produced by preparing at least one coating mixture comprising the conductive components and the at least one photopolymer composition, and coating a substrate, such as, for example, a transparent substrate. Such a coated substrate may, for example, be dried to form a transparent coated film that is radiation curable.

Layers may be coated using any suitable methods, including, for example, dip-coating, wound-wire rod coating, doctor blade coating, air knife coating, gravure roll coating, reverse-roll coating, slide coating, bead coating, extrusion coating, curtain coating, and the like. Examples of some coating methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Such methods may comprise drying one or more coated layers, using a variety of known methods. Examples of some drying methods are described in, for example, *Research Disclosure*, No. 308119, December 1989, pp. 1007-08, (available from Research Disclosure, 145 Main St., Ossining, N.Y., 10562, http://www.researchdisclosure.com), which is hereby incorporated by reference in its entirety.

Transparent conductive films are commonly coated on polymer substrates in order to achieve web coating capabilities and meet flexibility requirements of intended applications. Often, specific patterns of conductive materials are desired, which can be achieved by etching a transparent conductive film in the pattern desired. For example, European Patent Publication EP 1947701, published Jul. 23, 2008, hereby incorporated by reference in its entirety, describes a method that involves deposition of silver nanowires on a substrate followed by a second coating step with a photopolymer layer overcoat. After curing in a pattern, the uncured portions are removed by differential adhesion. The overcoat may be removed with a strong base, such as described in U.S. Patent Application Publication 2008/0292979, published Nov. 27, 2008, which is hereby incorporated by reference in its entirety.

In at least some embodiments, the photopolymer composition is water developable. Examples of such water developable photopolymer compositions include those that have been used in high resolution lithographic applications, such as, for example, in the pre-sensitized offset printing plates that had been marketed by 3M under the HYDROLITH™ trade name. Such plates are water resistant until exposed to patterning by radiation, after which the unexposed areas of the material on the plate can be removed using water. See, for example, U.S. Pat. No. 4,401,743 to Incremona, issued Aug. 30, 1983, and U.S. Pat. No. 4,408,532 to Incremona, issued Oct. 11, 1983, each of which is hereby incorporated by reference in its entirety.

Use of a water developable photopolymer composition allows coating an integral single conductive layer that is radiation curable and water developable, without using a separate photopolymer layer overcoat, while also avoiding use of developing compositions comprising such chemicals as strong bases. Such a water developable photopolymer composition may be patterned by exposure to radiation, and may then be developed with water to form a patterned conductive coating.

At least some embodiments provide such transparent conductive films, where the substrate is a flexible glass substrate.

Other embodiments provide methods comprising providing a conductive film comprising a substrate and at least one layer disposed on the substrate, where the at least one layer comprises conductive components and at least one photopolymer composition; and exposing the transparent conductive film to radiation. Such a conductive film may, for example, be a transparent conductive film. Such a photopolymer composition may, for example, be water developable. Such a substrate may, for example, be a flexible glass substrate.

Other embodiments provide methods comprising providing a conductive film comprising a substrate and at least one coating disposed on the substrate, where the coating comprises conductive components and at least one photopolymer composition; and developing the film to form a patterned conductive film. Such a patterned conductive film may, for example, be a transparent patterned conductive film. Such a photopolymer composition may, for example, be water developable. Such a substrate may, for example, be a flexible glass substrate.

EXAMPLES

Materials

Unless otherwise noted, materials were available from Sigma-Aldrich, Milwaukee, Wis.

Bis(vinylsulfonyl)methane (BVSM) cross-linker was obtained from Eastman Kodak.

CAB171-15 is a cellulose acetate butyrate polymer (Eastman Chemical).

DESMODUR® N3300 is an aliphatic polyisocyanate (hexamethylene diiosicyanate trimer) (Bayer).

GORILLA® 2317 is an alkali aluminosilicate glass (Corning).

LAROSTAT® 264A is an ethyl sulfate based cationic quaternary salt (BASF).

Gel-PB is a phthalated gelatin (Eastman Gelatine, Peabody, Mass.).

Silver nanowires had an average diameter of 90±20 nm and a length of 20-60 μm (Blue Nano, Cornelius, N.C.).

Example 1

Solution A was prepared by adding 8.0 g of Gel-PB, 192 g of deionized water, and 0.04 g of 4-chloro-3,5-dimethylphenol to a flask that was then heated to 50° C. for 30 min with stirring.

To a 0.4 g aliquot of Solution A at 50° C. was added 0.7 g of deionized water, 0.016 g of a 1 wt % aqueous solution of LAROSTAT® 264A, 0.05 g of a 1 wt % aqueous solution of BVSM, and 0.25 g of a 2.5 wt % silver nanowire dispersion in 2-propanol. The resulting mixture was mixed on a wrist shaker to obtain a coating dispersion.

The coating dispersion was coated onto a GORILLA® 2317 flexible glass substrate using a #10 Mayer rod. The resulting coated substrate was died in an oven at 107° C. for 6 min to obtain a transparent coated film.

The transparent coated film was evaluated for surface resistivity using an R-CHEK™ RC2175 meter (Electronic Design to Market, Toledo, Ohio) and for percent transmittance and haze according to ASTM D1003 using a HAZE-GARD PLUS Hazemeter (BYK-Gardner, Columbia, Minn.). These results are summarized in Table I.

Example 2

A coating dispersion was prepared by mixing at room temperature for 2 min 100 parts by weight of CAB171-15 cellulose acetate butyrate polymer, 29 parts by weight of N3300 isocyanate, 10 parts by weight of bismuth neodecanoate, 21 parts by weight of silver nanowires, 333 parts by weight of methyl ethyl ketone, 336 parts by weight of ethyl lactate, and 315 parts by weight of isopropanol.

The coating dispersion was coated onto a GORILLA® 2317 flexible glass substrate using a #10 Mayer rod. The resulting coated substrate was died in an oven at 107° C. for 6 min to obtain a transparent coated film.

The transparent coated film was evaluated for surface resistivity using an R-CHEK™ RC2175 meter (Electronic Design to Market, Toledo, Ohio) and for percent transmittance and haze according to ASTM D1003 using a HAZE-GARD PLUS Hazemeter (BYK-Gardner, Columbia, Minn.). These results are summarized in Table I.

Example 3

Comparative

Table II shows corresponding results for a PET substrate ("PET"), a polyurethane matrix coated on a PET substrate and polyurethane ("PU/PET"), silver nanowires deposited from an aqueous dispersion onto a PET substrate ("AgNW/PET"), and a silver nanowire in polyurethane layer which had been coated on a PET substrate ("AgNW/PU/PET), which were presented in Example 2 of European Patent Publication EP1965438, which is hereby incorporated by reference in its entirety.

TABLE I

| Sample | Transmission (%) | Haze (%) | Resistivity (ohms/sq) |
| --- | --- | --- | --- |
| Example 1 | 83.0 | 9.38 | 60 |
| Example 2 | 89.0 | 5.22 | 110 |
| GORILLA 2317 Substrate | 93.2 | 0.15 | Non-conductive |
| CORNING Microscope Slide | 93.2 | 0.53 | Non-conductive |

TABLE II

| Sample | Transmission (%) | Haze (%) | Resistivity (ohms/sq) |
| --- | --- | --- | --- |
| PET | 91.6 | 0.76 | Non-conductive |
| PU/PET | 92.3 | 0.88 | Non-conductive |
| AgNW/PET | 87.4 | 4.76 | 60 |
| AgNW/PU/PET | 87.2 | 5.74 | 60 |

There is described a transparent conductive film comprising: (a) a flexible glass substrate; and (b) at least one conductive layer disposed on the flexible glass substrate, the at least one conductive layer comprising at least one metal nanoparticle.

In an embodiment, the flexible glass substrate has an average thickness less than about 500 μm, or an average thickness less than about 150 μm.

In an embodiment, the flexible glass substrate has an average thickness greater than about 10 μm and less than about 100 μm.

The flexible glass substrate can achieve a radius of curvature greater than about 5 mm and less than about 50 cm without breaking.

The flexible glass substrate can achieve a radius of curvature greater than about 10 mm and less than about 10 cm without breaking.

In an embodiment, the flexible glass substrate comprises an ion-exchanged glass.

In an embodiment, the flexible glass substrate comprises at least one of a silicate glass, an alkali silicate glass, an alkali aluminosilicate glass, an aluminosilicate glass, a borosilicate glass, an alkali aluminogermanate glass, an alkali germanate glass, or an alkali gallogermanate glass.

In an embodiment, the at least one metal nanoparticle comprises at least one nanowire, nanocube, nanorod, nanopyramid, or nanotube.

In an embodiment, the at least one metal nanoparticle comprises at least one nanowire.

In an embodiment, the at least one metal nanoparticle comprises at least one coinage metal.

In an embodiment, the at least one metal nanoparticle comprises silver.

In an embodiment, the at least one conductive layer has a surface resistivity less than about 150 ohms/sq, or a surface resistivity less than about 65 ohms/sq.

The embodiment can include a total light transmission of at least about 80%, or a total light transmission of at least about 85%.

The embodiment can further comprise at least one layer disposed between the flexible glass substrate and the at least one conductive layer.

There is described an article comprising: a transparent conductive film comprising: a flexible glass substrate; and at least one conductive layer disposed on the flexible glass substrate, the at least one conductive layer comprising at least one metal nanoparticle.

The article can comprise at least one of an electronic display or a touch screen.

The article can comprise comprising a portable telephone, a cellular telephone, a computer display, a laptop computer, a tablet computer, a point-of-purchase kiosk, a music player, a television, an electronic game, or an electronic book reader.

There is also described a method comprising: (a) providing a flexible glass substrate; and (b) coating the flexible glass substrate with at least one composition comprising at least one metal nanoparticle.

In one embodiment of the method, the flexible glass substrate is provided on a roll.

In one arrangement, the coated flexible glass substrate is produced by the method.

In one embodiment, the method further comprises forming a transparent conductive film from the coated flexible glass substrate.

There is described a transparent conductive film produced by any one of the methods described above.

The invention claimed is:

1. A transparent conductive film comprising:
   a flexible glass substrate; and
   at least one conductive layer disposed on the flexible glass substrate,
   wherein the at least one conductive layer comprises at least one metal nanowire, the at least one conductive layer exhibits a surface resistivity less than about 150 ohms/sq, and the transparent conductive film exhibits a total light transmission of at least about 80%.

2. The transparent conductive film according to claim 1, wherein the flexible glass substrate has at least one of the following: (1) an average thickness less than about 500 μm, (2) an average thickness greater than about 10 μm and less than about 100 μm, (3) can achieve a radius of curvature greater than about 5 mm and less than about 50 cm without breaking, (4) can achieve a radius of curvature greater than about 10 mm and less than about 10 cm without breaking, or (5) comprises an ion-exchanged glass.

3. The transparent conductive film according to claim 1, wherein the flexible glass substrate comprises at least one of a silicate glass, an alkali silicate glass, an alkali aluminosilicate glass, an aluminosilicate glass, a borosilicate glass, an alkali aluminogermanate glass, an alkali germanate glass, or an alkali gallogermanate glass.

4. The transparent conductive film according to claim 1, wherein the at least one metal nanowire comprises at least one of the following: at least one coinage metal or silver.

5. The transparent conductive film according to claim 1, further comprising at least one layer disposed between the flexible glass substrate and the at least one conductive layer.

6. An article comprising:
   a transparent conductive film comprising:
   a flexible glass substrate; and
   at least one conductive layer disposed on the flexible glass substrate,
   wherein the at least one conductive layer comprises at least one metal nanowire, the at least one conductive layer exhibits a surface resistivity less than about 150 ohms/ sq, and the transparent conductive film exhibits a total light transmission of at least about 80%.

* * * * *